(12) United States Patent
Tao et al.

(10) Patent No.: US 6,870,273 B2
(45) Date of Patent: Mar. 22, 2005

(54) HIGH SPEED I/O PAD AND PAD/CELL INTERCONNECTION FOR FLIP CHIPS

(75) Inventors: Yuming Tao, Kanaka (CA); Vernon R. Little, White Rock (CA)

(73) Assignee: PMC-Sierra, Inc. (CA)

( * ) Notice: Subject to any disclaimer, the term of this patent is extended or adjusted under 35 U.S.C. 154(b) by 0 days.

(21) Appl. No.: 10/424,817

(22) Filed: Apr. 29, 2003

(65) Prior Publication Data

US 2004/0026794 A1 Feb. 12, 2004

Related U.S. Application Data

(60) Provisional application No. 60/375,802, filed on Apr. 29, 2002.

(51) Int. Cl.$^7$ ............................................... H01L 23/48
(52) U.S. Cl. ...................................... 257/778; 257/786
(58) Field of Search ................................ 257/778, 786, 257/773, 775, 207, 208

(56) References Cited

U.S. PATENT DOCUMENTS

| | | | |
|---|---|---|---|
| 6,140,710 A | * 10/2000 | Greenberg | .................. 257/786 |
| 6,215,377 B1 | 4/2001 | Douriet | |
| 6,232,660 B1 | 5/2001 | Kakimoto et al. | |
| 6,242,814 B1 | 6/2001 | Bassett | |
| 2004/0026794 A1 | * 2/2004 | Tao et al. | .................. 257/778 |

OTHER PUBLICATIONS

P. Petre et al., "Simulation and Performance of Passive Microwave and Millimeter Wave Coplanar Waveguide Circuit Devices with Flip Chip Packaging", IEEE Electrical Performance of Electronic Packaging, 1997, pp. 203–206.

Daniela Staiculescu, et al., "Design Rule Development for Microwave Flip–Chip Applications," IEEE Trans. on Microwave Theory and Techniques, vol. 48, No. 9, Sep. 2000, pp. 1476–1481.

* cited by examiner

*Primary Examiner*—Mark V. Prenty
(74) *Attorney, Agent, or Firm*—Clifford W. Vermette

(57) ABSTRACT

Gridded I/O pads for flip-chip packages in which a coaxial-like solder bump pad configuration is used in which the I/O pads closest to the signal or bump pad are power or ground pads. The ground pads surrounding the signal pad form a coaxial-like pad configuration for impedance matching at the transition from die to package substrate. The ground pads surrounding the signal pad may be connected by a metal trace to form a ground pad ring. The invention employs conductor-backed ground coplanar waveguides (GCPW), which match impedance at connections between I/O cells and signal pads to enhance signal transmission, avoid reflection and leakage, and provide superior electromagnetic shielding. The present invention also supports high quantities of I/Os for a given die size, and supports flexible power and ground placement.

23 Claims, 8 Drawing Sheets

HIGH SPEED I/O PAD AND PAD/CELL INTERCONNECTION FOR FLIP CHIPS

RELATED APPLICATIONS

This application claims the benefit of prior filed provisional application, Application No. 60/375,802 filed Apr. 29, 2002.

FIELD OF THE INVENTION

The present invention is related to the field of high-speed or high frequency semiconductor flip-chip die pads and pad/cell interconnection design.

DESCRIPTION OF RELATED ART

Flip chip technology provides improved signal integrity and flexible power and ground distribution on a semiconductor die. Flip-chip I/O pad structure consists of signal pads, $V_{ss}$, (ground) pads and $V_{dd}$ (power) pads. In the prior art, these pads are generally distributed on the die area such that there is a single array of $V_{ss}$ pads arranged around the periphery of the die. The die is then flipped onto the top of the package and attached with solder bumps. A prior art signal and power/ground pad arrangement, such as that disclosed by Bassett in U.S. Pat. No. 6,242,814, is illustrated in FIG. 1. FIG. 1(a) illustrates the signal 10, $V_{dd}$ (power) 20 and $V_{ss}$. (ground) 30 pads placed in a column for a set of single-ended signal I/O cells, and FIG. 1(b) illustrates a mixed pad matrix with differential signal pads 15, single-ended signal pads 10, and power/ground pads 20, 30. Such prior art I/O pad arrangements work for low-speed digital and mixed signal integrated circuits, however, suffer from cross talk and electromagnetic interference (EMI) as the semiconductor device's speed and/or frequency increase.

Flip chip technology, while being over 30 years old, has become a major player in the high-speed or high frequency packaging industry as the "Need for Speed" for high-speed ICs has created a demand for a package to serve not only as a device attachment platform, but also as an integral part of the circuit.

Generally, high frequency packages require three types of sealing: electromagnetic, hermetic, and mechanical (the latter two are beyond the scope of this invention). Considering a dielectric constant of the material for 10 Gbps or 40 Gbps semiconductor chips, the effective wavelength is generally in a range between several millimeters and 100 microns. The physical and electrical characteristics of the three-dimensional shape of the chips, such as I/O pad and solder bump configuration, as well as the characteristics of the materials, have a significant influence on the performance of the high-speed package. In other words, wavelength is in part determined by chip size and configuration. Therefore, in order to benefit from the improved signal integrity and flexible power and ground distribution of flip chips, superior electromagnetic shielding becomes critical. Accordingly, the present invention is directed to a gridded I/O pad structure that provides electromagnetic shielding through a universal template for the placement of high frequency or high speed signal pads and power/ground pads that provides electromagnetic shielding.

The connection of I/O cells to signal pads is also critical to ensure signal integrity for high-speed or high frequency signals. The traditional means of connection is through wire bonding or via connections such as that depicted in FIG. 2. Referring to FIG. 2, in order to shorten the length of the connection, I/O cells 40 are laid directly underneath or around the bump pad 50. To meet the metal density requirements of semiconductor design rules, dummy metal is typically required to fill the neighboring area, bringing in large parasitic capacitance that has a severe impact on the high-frequency characteristics of the semiconductor chip.

To eliminate or control the parasitics resulting from chip-to-chip or chip-to-package interconnections, controlled-impedance transmission lines have been deployed in microwave and millimeter wave monolithic integrated circuits (MMICs). FIG. 3 shows a Coplanar Waveguide (CPW) 60 and Ground Coplanar Waveguide (GCPW) 70 in cross section. CPWs 60 and GCPWs 70 provide a number of advantages over microstrips, such as accommodation of high density circuitry, lower losses, and support of flip chip packages.

U.S. Pat. No. 6,215,377, issued to D. F. Douriet, et al., discloses a trace pattern of a coplanar waveguide that matches impedances at all transitions. However, like other MMICs constructed with coplanar waveguides, it has limited I/O ports to carry high speed or high frequency signals.

Accordingly, it is an object of the present invention to provide a universal solution for high-speed and/or high frequency I/O pad structures and pad/cell interconnections capable of carrying data streams at multiple-gigabit per second bit-rates.

It is a further object of this invention to provide a semiconductor die I/O pad to cell interconnection, which enhances signal propagation, reduces impedance mismatches, and increases electromagnetic interference shielding for high frequency signals.

It is yet a further object of this invention to provide a flexible standardized grid structure that simplifies both semiconductor and package design and characterization, thus providing better performance and lower costs.

SUMMARY OF THE INVENTION

A semiconductor die for use in flip chip applications comprising an array of I/O pads. The array comprises a signal pad and a plurality of non-signal pads. The non-signal pads may be ground pads and/or power pads and are situated about the signal pad such that the signal pad is surrounded by an area of substantially constant DC potential.

The invention provides gridded I/O pads for flip-chip BGA packages that provide electromagnetic wave shielding and that exhibit superior high-speed or high frequency characteristics when compared to the prior art. The present invention also supports high quantities of I/Os for a given die size, and supports flexible power and ground placement. The invention further provides a virtual coaxial transmission line by providing a three-dimensional structure having a coaxial-like solder bump pad configuration for impedance matching at the transition from die to package substrate.

The invention employs a trace pattern of conductor-backed ground coplanar waveguides (GCPW), which matches impedance at the connection between I/O cells and signal pads to enhance signal transmission, avoid reflection and leakage, and provide superior electromagnetic shielding.

The flexible standardized grid structures of the present invention simplify both semiconductor and package design and characterization, thus providing better performance and lower costs.

BRIEF DESCRIPTION OF THE DRAWINGS

The invention itself both as to organization and method of operation, as well as additional objects and advantages thereof, will become readily apparent from the following detailed description when read in connection with the accompanying drawings, wherein.

DETAILED DESCRIPTION OF THE INVENTION

Figure 1A:
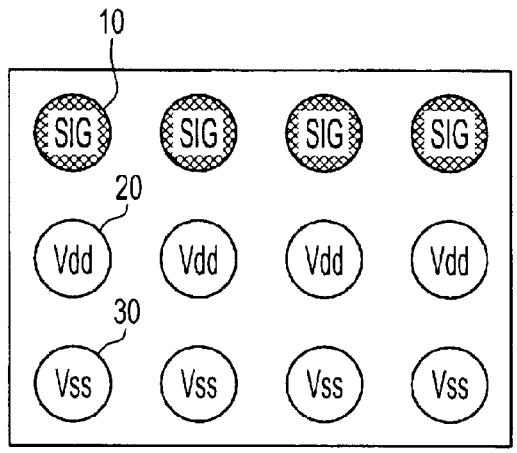
FIG. 1(a) illustrates the signal, Vss (ground) and Vdd (power) pads of a prior art semiconductor device.
Figure 1B:
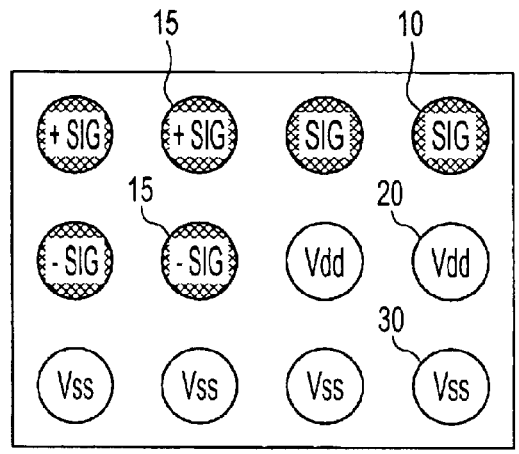
FIG. 1(b) illustrates a prior art mixed pad matrix.
Figure 2:
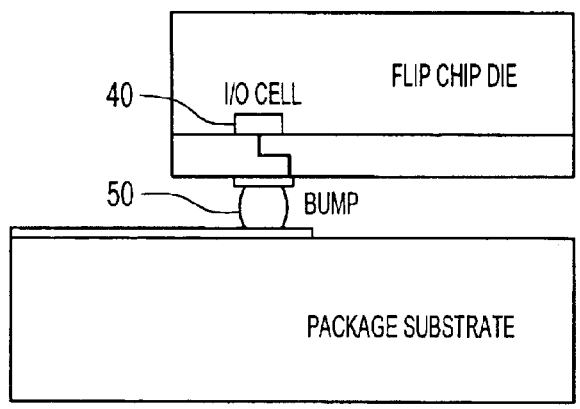
FIG. 2 is a cross section view of a prior art die I/O cell to pad interconnection.
Figure 3A:
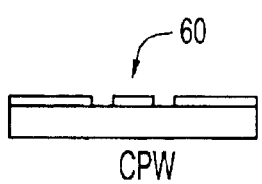
FIG. 3(a) is a cross section view of a prior art coplanar waveguide (CPW)
Figure 3B:
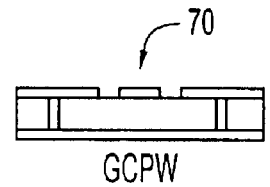
FIG. 3(b) is a cross section view of a prior art ground coplanar waveguide (GCPW)
Figure 4:
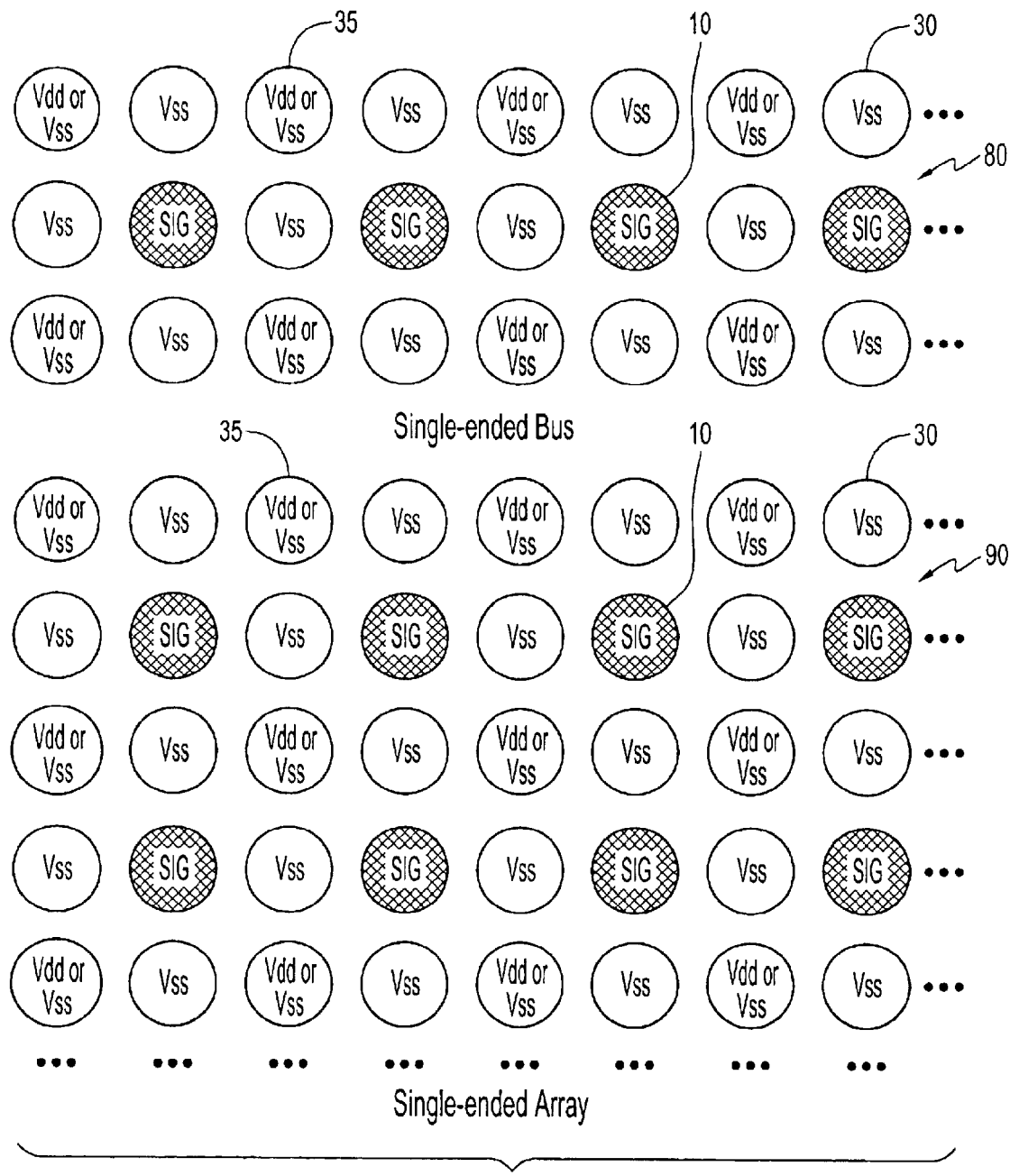
FIG. 4 is a schematic view of a gridded I/O pad for single-ended signal bus and array applications.
Figure 5:
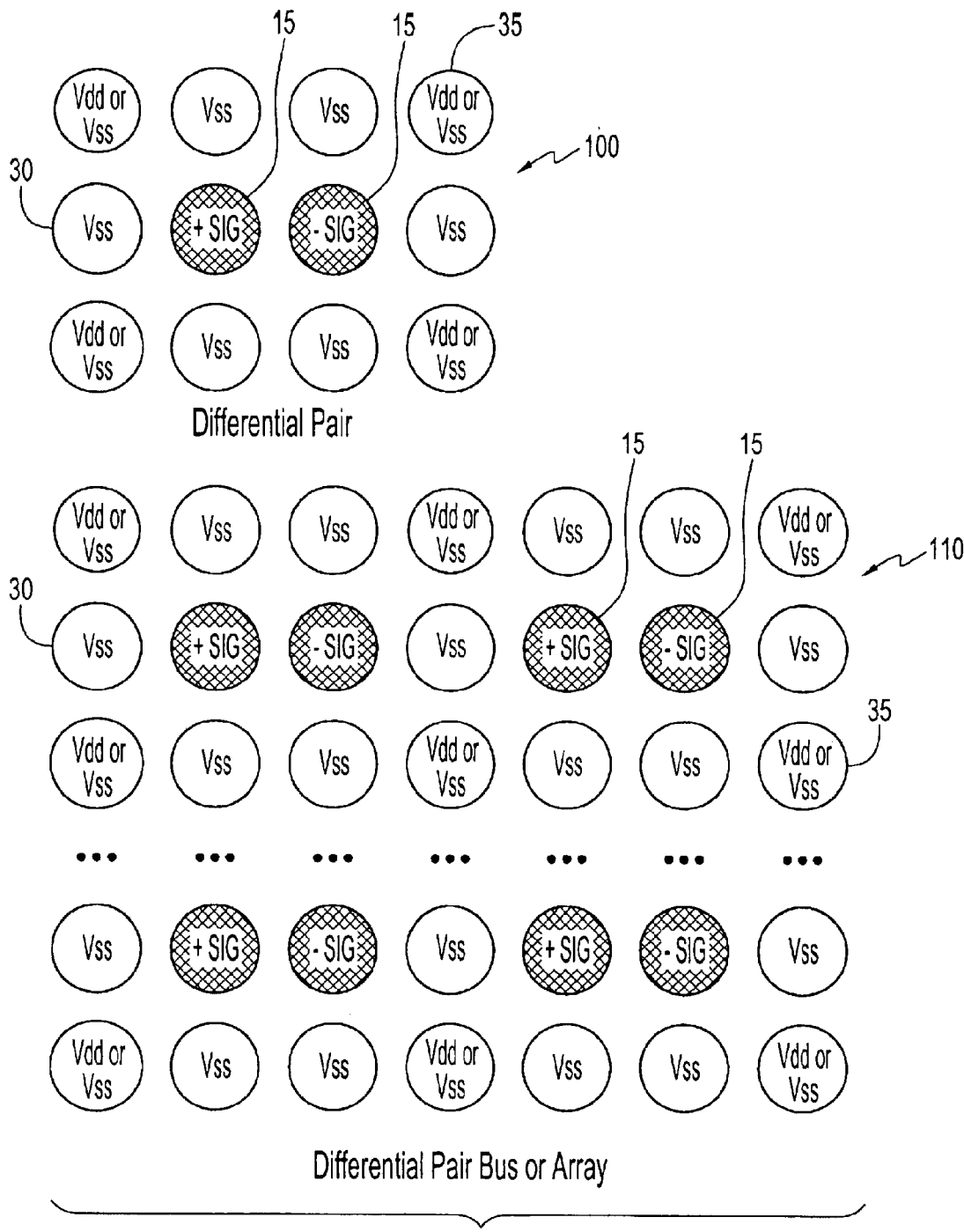
FIG. 5 is a schematic view of a gridded I/O pad for differential signal bus and array applications.

FIG. 4 illustrates a first aspect of the present invention, which comprises a gridded I/O pad concept for single-ended buses 80 and arrays 90 for high-speed or high frequency flip-chip die and packaging applications. The I/O pad configuration comprises signal pads 10, power pads and ground pads 30. Power/ground pads 35 may be either power or ground pads. FIG. 5 illustrates an I/O pad configuration, comprising signal pads 15, power pads and ground pads 30 (power/ground pads 35 may be either power or ground pads) for a differential signal bus 100 and array 110 on a flip chip die. Power/ground pads 35 may be either power or ground pads. Common to each embodiment in FIGS. 4 and 5, is the principle that all of the pads nearest the high-speed signal (SIG) pad 10 or pads (+SIG, −SIG) 15 should be dedicated to ground pads (Vss) 30 while the power/ground pads 35, the ones sitting diagonally with respect to the signal pad 10 or pads 15, should be placed as either power (Vdd) pads or ground (Vss) pads.

Figure 6A:
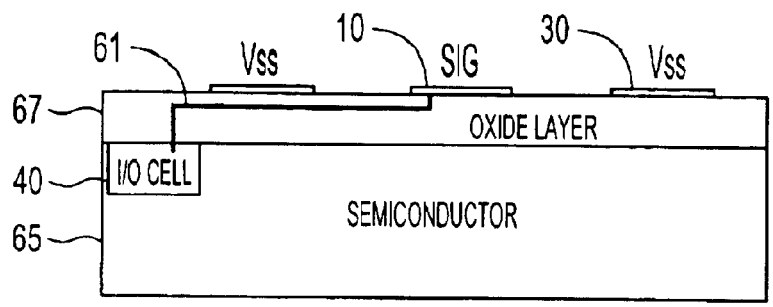
FIG. 6(a) is a cross section of an I/O cell to pad interconnection.
Figure 6B:
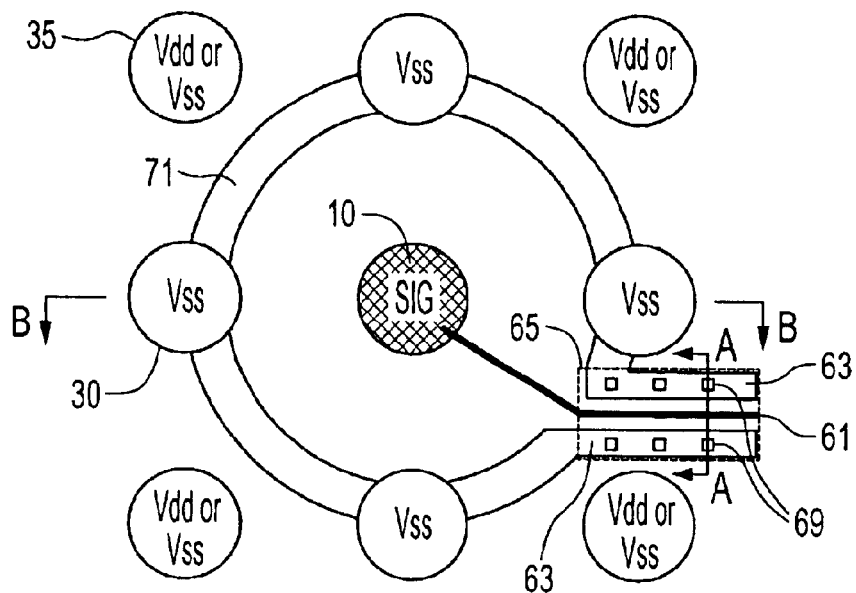
FIG. 6(b) shows an overhead view of an I/O cell to pad interconnection and a cross-section of the center trace and ground pad ring that form part of the conductor-backed ground coplanar waveguide.
Figure 6C:
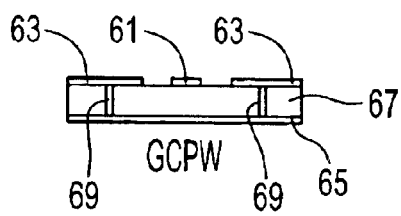
FIG. 6(c) is a cross section of a conductor-backed ground coplanar waveguide.

FIGS. 6(a), 6(b) and 6(c) illustrate further aspects of the present invention. FIG. 6(a) shows a cross-sectional view of a connection for the signal pad 10 to I/O cell 40 (the cross-section is taken along the line B—B in FIG. 6(b) although unsectioned trace 61 is included), while FIG. 6(b) shows an overhead view, and FIG. 6(c) a cross-section of a conductor-backed ground coplanar waveguide (GCPW) (the cross-section is taken along the line A—A in FIG. 6(b)). Illustrated is an I/O cell to signal pad 10 (bump pad) interconnection arrangement on a semiconductor flip-chip die for single-ended signal bus or array applications. In FIG. 6(a), although the signal trace 61 is shown to be beneath the surface of the oxide layer 67, this is done only for the purposes of illustration. The signal trace 61 in fact runs along the surface of the oxide layer 67 as shown in FIG. 6(c).

Referring to FIGS. 6(a), (b) and (c), signal pads (SIG) 10, power pads (Vdd) and ground pads (Vss) 30 are sitting on the top surface of oxide layer 67 attached to the semiconductor material 65 (power/ground pads 35 may be either power or ground pads). Pads nearest the high-speed signal pad (SIG) 10 are dedicated to ground pads 30 while the ones sitting diagonally 35 may be either power pads or ground pads. The ground pads 30 are connected together with a metal trace to create a ground pad ring 71, which acts as an outer conductor of a virtual coaxial line. The signal trace 61 of a conductor-backed GCPW is extended to feed the signal pad 10 while the ground planes 63 are connected to the pad ring 71 and also to the backed conductor 65 via arrays 69. Also shown is a connection for the central trace 61 of the GCPW to the I/O cell 40 on the semiconductor die. With this arrangement, a matched impedance pathway from the I/O cell 40 to the signal bump pad 10 is achieved that provides superior signal integrity for high-speed or high frequency signals.

Figure 7A:
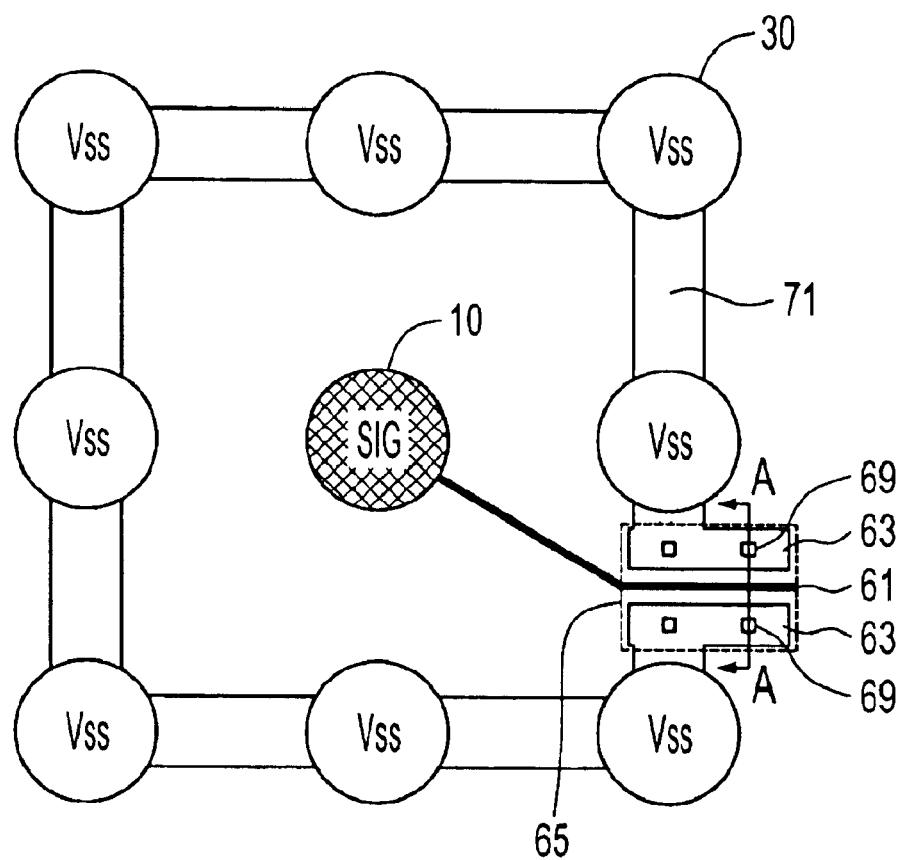
FIG. 7(a) shows an overhead view of an alternative I/O cell to pad interconnection.
Figure 7B:
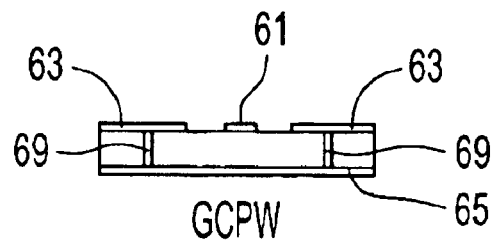
FIG. 7(b) is a cross section of the GCPW of FIG. 7(a)

FIGS. 7(a) and 7(b) illustrate an alternative embodiment of the I/O cell (not shown) to bump pad 10 interconnection arrangement on a semiconductor flip-chip die for single-ended signal bus or array applications (FIG. 7(b) shows a cross-section taken along the line A—A in FIG. 7(a)). This embodiment has improved electromagnetic interference shielding, with eight ground (Vss) pads 30 laid out and connected together in a square "ring" 71 fashion around the signal pad (SIG) 10. Selective dummy-metal fill may be used to form a 50 ohm coaxial-like solder bump pad configuration.

Figure 8A:
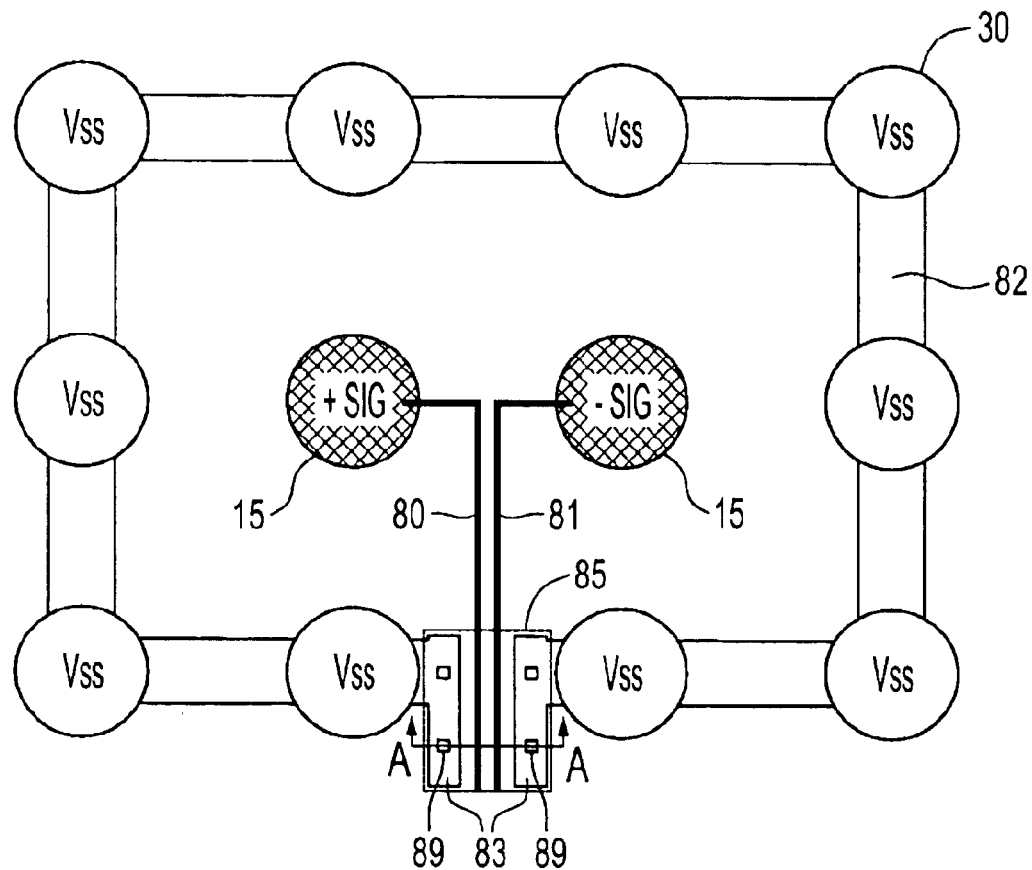
FIG. 8(a) shows an overhead view of an I/O cell to pad interconnection for a differential signal bus or array applications.
Figure 8B:
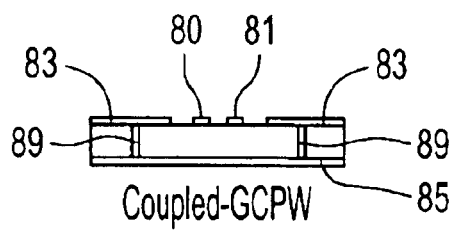
FIG. 8(b) is a cross-section of the GCPW of FIG. 8(a)

FIGS. 8(a) and 8(b) illustrate an I/O cell (not shown) to bump pad 15 interconnection arrangement on a semiconductor flip-chip die for high-speed or high frequency differential signal bus or array applications, in which all pads adjacent to a signal pair (+SIG and −SIG) 15 are ground pads 30 (FIG. 8(b) shows a cross-section taken along the line A—A in FIG. 8(a)). The ground pads 30 are connected together with a metal trace to create a ground pad ring 82 which acts as the outer conductor of virtual coaxil line.

Referring again to FIGS. 8(a) and 8(b), the two signal traces 80 and 81 of a coupled conductor-backed ground coplanar waveguide are extended to the interior of the ground pad ring 82 but are kept in a coupled parallel line format, thereafter splitting into two separate lines, each feeding one of the differential signal pads 15, +SIG and −SIG. The ground planes 83, and one backed conductor plane 85 are stopped at the edge of the ground pad ring 82 but connected to the ground pad ring 82. The ground planes 83 are also grounded through arrays 89, to the backed conductor plane 85. The traces 80, 81 are connected to the I/O cell's circuitry on a semiconductor die (not shown). With this arrangement, a matched impedance pathway is achieved to propagate the differential signals from the I/O's circuitry to the signal bump pads 15 and BGA package. With reference to FIGS. 4–8, the ground pads 30 surrounding the signal pads 10, 15 are connected together through metal traces to create pad rings 71, 82. Every signal 10 or signal pair 15 has a corresponding ground pad ring 71, 82 that acts to contain electromagnetic waves. In other words, the present invention provides a three-dimensional coaxial-like structure about the signal pads 10, 15 that provides superior EMI shielding. In the preferred embodiments, a GCPW is constructed to connect the die I/O cells 40 to the signal pads 10, 15.

Figure 9A:
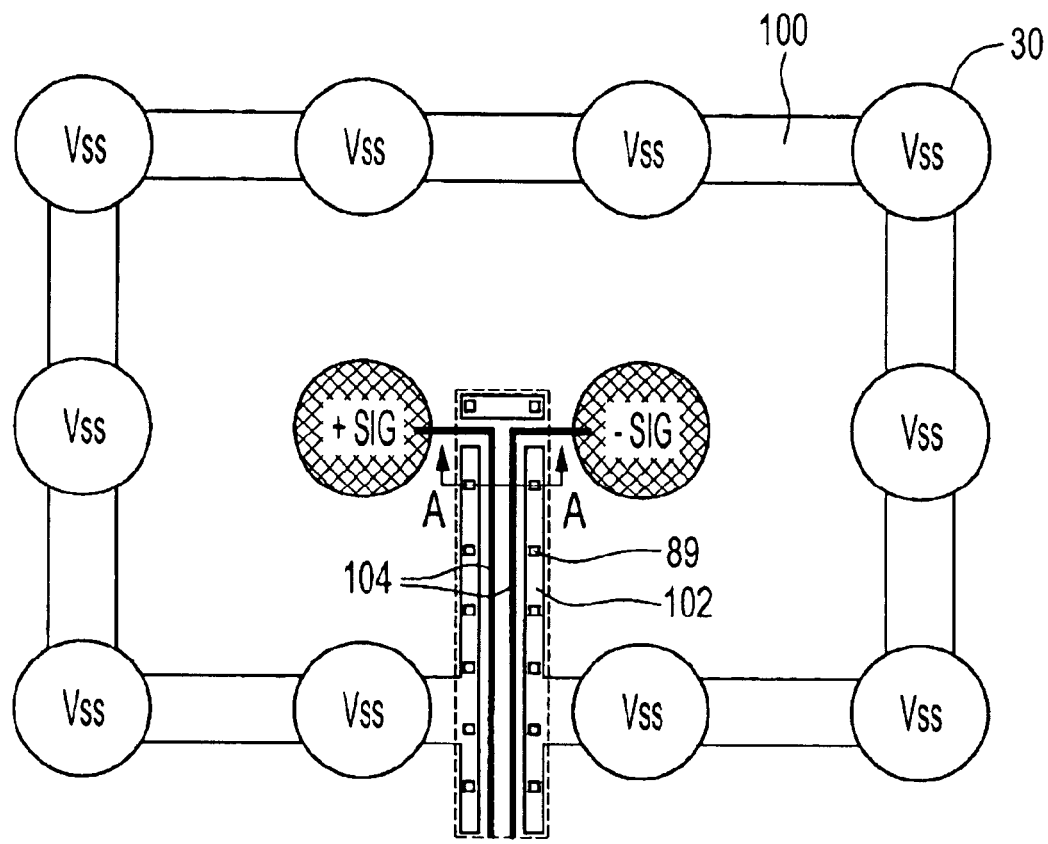
FIG. 9(a) is an overhead view of an alternate embodiment of the interconnection shown in FIG. 8.
Figure 9B:
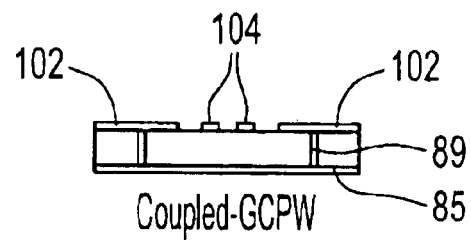
FIG. 9(b) is a cross-section of the GCPW of FIG. 9(a)

FIGS. 9(*a*) and 9(*b*) illustrate an alternate embodiment of the arrangement shown in FIG. 8, in which a section of GCPW with finite-ground plane 102 is penetrated into the interior area of ground pad ring 100 (FIG. 9(*b*) shows a cross-section taken along the line A—A in FIG. 9(*a*)). The coupled line pair 104 is then split into two single-ended lines wherefrom two conductors are extended to connect the signal pads 15. The embodiment of FIGS. 9(*a*) and 9(*b*) results in an improved electromagnetic field transition, or in other words, better impedance matching at the transition of the coupled conductor-backed ground coplanar waveguide to the coupled coaxial-like pad configuration.

With reference to FIGS. 6–9, although the preferred embodiments of the invention described herein comprise a signal pad or pads surrounded by a ring of ground pads connected by a metal trace, it is clear to those skilled in the art that it is possible to construct and use an embodiment comprising a ring of power pads connected by a trace. The essential aspect of the invention is that the signal pad(s) are shielded from sources of interference by a zone of quiet or constant DC potential. Accordingly, further embodiments are also contemplated wherein the signal pad is not completely surrounded by ground or power pads but rather ground or power pads are placed between the signal pad and sources of interference.

Figure 10:
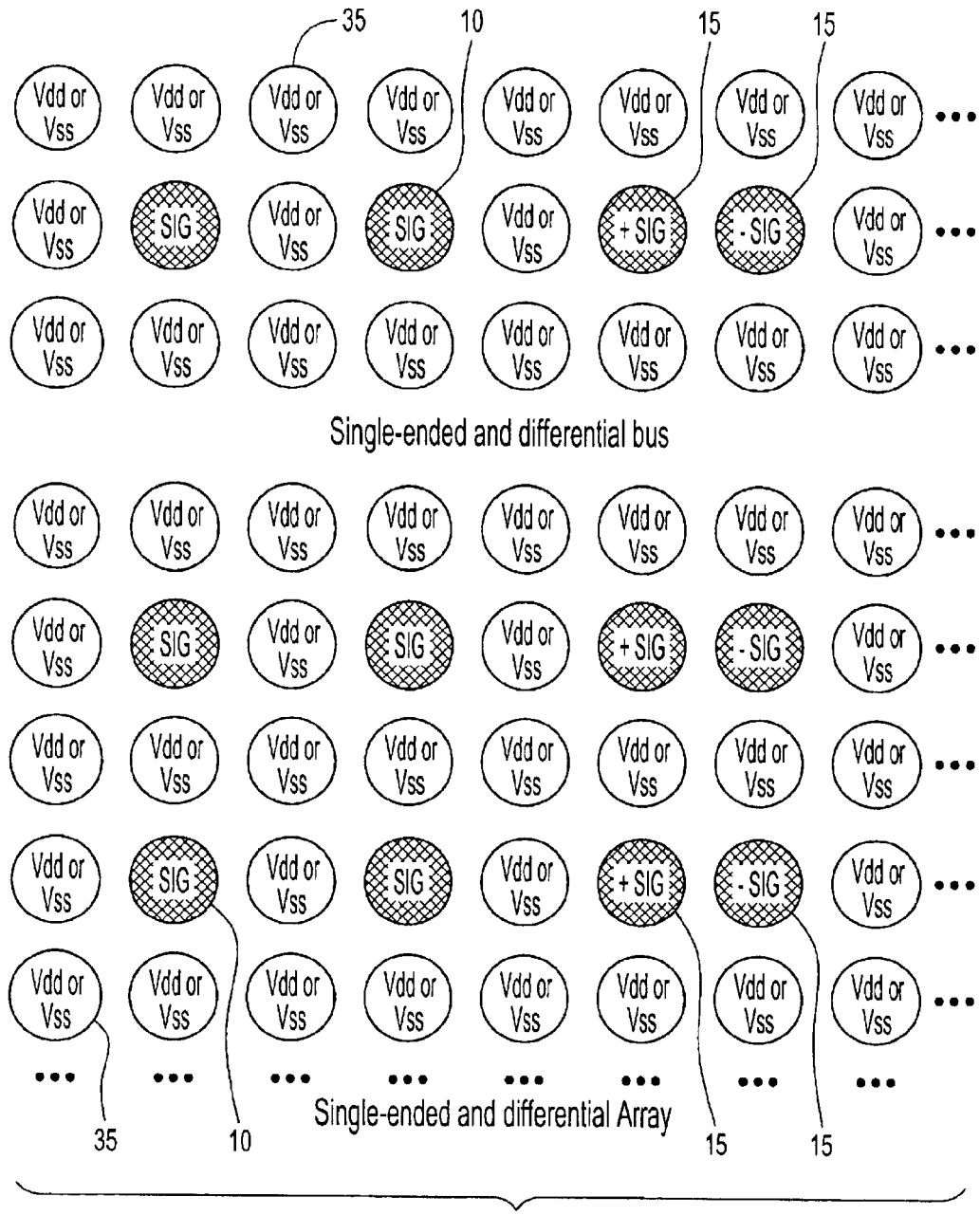
FIG. 10 is an overhead view of gridded I/O pad configurations defined for low-speed signal I/O bus or array applications.

Although the gridded I/O pad concept of the present invention is directed to high-speed or high frequency differential or single-ended signal I/O buses and arrays for flip-chip packaging applications, it is also applicable to low-speed or low frequency signal I/Os. As is illustrated in FIG. 10, gridded I/O pad configurations are defined for low-speed signal I/O buses or arrays, in which power/ground pads 35 are placed along the periphery of each signal pad 10 or pad pair 15. Unlike previous embodiments described herein (see FIGS. 4 and 5) the pads nearest the signals pads 10, 15 of FIG. 10 may be either ground or power pads. The controlled-impedance pathways of FIGS. 6–9 may or may not be required for the connection of active circuitry to signal pads 10, 15.

The present invention comprises the following inventive elements:
(a) a gridded I/O pad layout wherein each signal pad is surrounded by ground and/or power pads;
(b) a gridded I/O pad layout wherein each signal pad is surrounded by a ground and/or power pads wherein the ground pads are connected to one another by a trace to form a ground pad ring;
(c) controlled-impedance transmission lines formed by a three-dimensional structure having a coaxial-like solder bump pad configuration for impedance matching at the transition from die to package substrate;
(d) a conductor-backed ground coplanar waveguide, which matches impedance at the connection from high-speed or high frequency I/O cells to the signal pads to enhance signal transmission, avoid reflection and leakage, and provide superior electromagnetic shielding.

The gridded I/O pad layouts of (a) and (b) make possible the use of pre-tooled BGA packages where both normal low-speed signal lines and controlled impedance transmission lines can be defined by a single layer of metal interconnect.

The present invention provides a universal solution for semiconductor die I/O pad configuration and pad to cell interconnection, which enhances signal propagation, reduces impedance mismatches and increases electromagnetic interference shielding for high frequency signals.

This invention also allows the design of a flexible standardized grid structure that simplifies both semiconductor and package design and characterization, thus providing better performance and lower costs.

What is claimed is:

1. A semiconductor die for use in flip chip applications comprising an array of I/O pads, said array comprising at least one signal pad and a plurality of non-signal pads, said plurality of non-signal pads being made up of ground pads and power pads, wherein said signal pad is surrounded by said non-signal pads and wherein said signal pad is connected to an I/O cell by a signal trace.

2. The semiconductor die of claim 1, wherein said array of I/O pads is arranged to form a right angled grid.

3. The semiconductor die of claim 1, wherein said signal pad comprises two differential signal pads and wherein each of said differential signal pads is connected to said I/O cell by a signal trace.

4. The semiconductor die of claim 1, wherein said signal pad is surrounded by eight of said non-signal pads.

5. The semiconductor die of claim 1, wherein the non-signal pads nearest said signal pad are ground pads.

6. The semiconductor die of claim 1, wherein said non-signal pads are ground pads.

7. The semiconductor die of claim 4, wherein 4 of said non-signal pads nearest said signal pad are ground pads.

8. The semiconductor die of claim 5, wherein said ground pads are connected to one another by a metal trace to form a ground pad ring.

9. The semiconductor die of claim 4, wherein said signal pad is surrounded by 8 ground pads and said 8 ground pads are connected to one another by a metal trace to form a ground pad ring.

10. The semiconductor die of claim 1, wherein said non-signal pads are power pads.

11. The semiconductor die of claim 8, wherein said ground pad ring is connected to a conductor-backed ground coplanar waveguide, said conductor-backed ground coplanar waveguide having two ground planes, one on either side of said signal trace, wherein each of said ground planes is connected to said ground pad ring.

12. The semiconductor die of claim 11, wherein said ground planes are connected to a backed conductor by a plurality of arrays.

13. The semiconductor die of claim 11, wherein said conductor-backed ground coplanar waveguide extends along said signal trace into said ground pad ring to a point adjacent said signal pad.

14. The semiconductor of claim 11, wherein said signal pad comprises two differential signal pads, wherein each of said differential signal pads is connected to said I/O cell by a signal trace, and wherein said signal traces extend between said ground planes.

15. A semiconductor die for use in flip chip applications comprising an array of I/O pads, said array comprising at least one signal pad and a plurality of non-signal pads, said plurality of non-signal pads being made up of ground pads and power pads, wherein said non-signal pads are positioned about said signal pad such that said signal pad is surrounded by an area of substantially constant DC potential, and wherein said signal pad is connected to an I/O cell by a signal trace.

16. The semiconductor die of claim 15, wherein said signal pad comprises two differential signal pads and wherein each of said differential signal pads is connected to said I/O cell by a signal trace.

17. The semiconductor die of claim 15, wherein the non-signal pads nearest said signal pad are ground pads.

18. The semiconductor die of claim 15, wherein said non-signal pads are ground pads.

19. The semiconductor die of claim 15, wherein said non-signal pads are power pads.

20. The semiconductor die of claim 17, wherein said ground pads are connected to one another by a metal trace to form a ground pad ring.

21. The semiconductor die of claim 19, wherein said power pads are connected to one another by a metal trace to form a power pad ring.

22. The semiconductor die of claim 20, wherein said ground pad ring is connected to a conductor-backed ground coplanar waveguide, said conductor-backed ground coplanar waveguide having two ground planes, one on either side of said signal trace, wherein each of said ground planes is connected to said ground pad ring.

23. The semiconductor die of claim 22, wherein said ground planes are connected to a backed conductor by a plurality of arrays.

* * * * *